United States Patent
Tokito

(10) Patent No.: US 7,423,900 B2
(45) Date of Patent: Sep. 9, 2008

(54) METHODS AND APPARATUS FOR LOW POWER SRAM USING EVALUATION CIRCUIT

(75) Inventor: Shunsaku Tokito, Austin, TX (US)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 11/559,982

(22) Filed: Nov. 15, 2006

(65) Prior Publication Data

US 2008/0112234 A1    May 15, 2008

(51) Int. Cl.
*G11C 11/00*    (2006.01)
(52) U.S. Cl. ............ 365/154; 365/203; 365/189.011
(58) Field of Classification Search .......... 365/154
See application file for complete search history.

(56) References Cited

U.S. PATENT DOCUMENTS

2004/0130926 A1* 7/2004 Nakase .............. 365/145
2006/0291300 A1* 12/2006 Di Gregorio ........... 365/189.08
2007/0019461 A1* 1/2007 Adams et al. ............ 365/154
2007/0041239 A1* 2/2007 Takeda ................... 365/154

* cited by examiner

*Primary Examiner*—Hoai V. Ho
*Assistant Examiner*—Anthan T Tran
(74) *Attorney, Agent, or Firm*—Matthew B. Dernier; Kaplan Gilman Gibson & Dernier LLP

(57) ABSTRACT

Methods and apparatus provide for controlling an SRAM memory, the SRAM memory including a plurality of memory cells arranged in an array of rows (word lines) and columns (bit lines), including: mirroring logic values of at least one of the bit lines to a global bit line; driving the global bit line to a pre-charge logic value in response to a clock signal that cycles at least one time during successive read and write operations to the memory cell; maintaining the global bit line at the pre-charge logic value during a write operation in which a logic value is written to the bit line that is opposite to the pre-charge logic value.

9 Claims, 6 Drawing Sheets

102

METHODS AND APPARATUS FOR LOW POWER SRAM USING EVALUATION CIRCUIT

BACKGROUND

The present invention relates to methods and apparatus for controlling static random access memory (SRAM), and in particular for reducing the power dissipation of the SRAM based on the data stored therein.

SRAM memory cells store data in the form of complementary low voltage and high voltage at opposite sides of the cell. An SRAM, unlike dynamic random access memory (DRAM), maintains the data content of the memory calls as long as power is applied to the cell. DRAM memory cells, on the other hand, are periodically refreshed with the stored data content. An SRAM cell includes a "true" node associated with a bit line (BLT) of the SRAM memory and a complementary node associated with a complementary bit line (BLC) of the SRAM memory. When the true node is read as a high voltage, the value of the SRAM memory cell is digital one. If the true node is read as a low voltage, the value of the SRAM memory cell is a digital zero.

During write and read cycles, a conventional SRAM memory system will employ a pre-charge circuit to drive the bit line BLT and the complementary bit line BLC to a power supply voltage of the SRAM memory, Vdd, before data is written to the memory cell. During the time that the data is actually written to the SRAM memory cell, a write buffer drives the bit line BLT and the complementary bit line BLC. During the read operation, the active components of the SRAM memory cell itself will drive the bit line BLT, which is sensed (using so-called evaluation circuitry) to determine the value of the stored data bit in the cell.

The conventional circuitry for accessing (or evaluating) the contents of each memory cell via the bit line BLT includes combinational logic and/or transistor circuitry to mirror the stored data value onto a global bit line (GBL). The conventional evaluation circuitry includes a portion for charging the GLB and a portion for interfacing a respective BLT line to the GBL. Thus, the conventional evaluation circuitry includes a plurality of interface portions (one portion for each BLT of a word line) and a single charging portion for the word line. The conventional evaluation circuitry is operable such that during read or write operations the GBL swings (particularly during a write data=0 operation) and clocking circuitry of the charging portions is active, thereby consuming AC power. Thus, the power dissipation (particularly during successive write cycles) is significant.

The power dissipation problem becomes significantly worse as the frequency of the clock increases and the size of the SRAM increases, which is an ongoing circumstance as higher and higher memory performance remains a design goal. Accordingly, there is a need in the art for a new approach to controlling SRAM memory cells in order to counteract the increase in power dissipation resulting from higher and higher clock frequencies and larger and larger SRAM memories.

SUMMARY OF THE INVENTION

In accordance with one or more embodiments of the invention, In accordance with the invention, the conventional evaluation circuitry is modified such that: (i) the GBL does not swing (e.g., during a write data=0 operation); and (ii) the clocking circuitry for charging the GBL is only active upon read operations. This significantly reduces power dissipation in the system, particularly when numerous write cycles are performed.

In accordance with one or more embodiments of the invention, methods and apparatus provide for controlling an SRAM memory, the SRAM memory including a plurality of memory cells arranged in an array of rows (word lines) and columns (bit lines), including: mirroring logic values of at least one of the bit lines to a global bit line; driving the global bit line to a pre-charge logic value in response to a clock signal that cycles at least one time during successive read and write operations to the memory cell; and maintaining the global bit line at the pre-charge logic value during a write operation in which a logic value is written to the bit line that is opposite to the pre-charge logic value.

In accordance with one or more embodiments of the invention, methods and apparatus provide for prohibiting the mirroring of the logic value of the bit line to the global bit line during a write operation in which a logic value is written to the bit line that is opposite to the pre-charge logic value.

In accordance with one or more embodiments of the invention, an SRAM memory system includes: a plurality of memory cells arranged in an array of rows (word lines) and columns (bit lines); at least one interface circuit operable to mirror logic values of at least one of the bit lines to a global bit line; and at least one pre-charge circuit operable to drive the global bit line to a pre-charge logic value in response to a clock signal, wherein the interface circuit is prohibited from mirroring the logic value of the bit line to the global bit line during a write operation in which a logic value is written to the bit line that is opposite to the pre-charge logic value.

The pre-charge logic value may be a logic high value and the logic value to be written to the bit line that is opposite to the pre-charge logic value is a logic low value. For example, the pre-charge logic value may be a supply (Vdd) voltage potential, and the logic value to be written to the bit line that is opposite to the pre-charge logic value is a ground potential.

The interface circuit may include: a first transistor having a high current terminal that switches the global bit line to a reference potential in response to a control signal on a control terminal thereof; and a combinational logic circuit including at least one logic gate operable to provide the control signal to the first transistor as a function of the bit line. For example, the interface circuit may include a second transistor having a high current terminal that shunts the control signal from the control terminal of the first transistor to a reference potential in response to a write signal indicative of the write operation in which the logic value to be written is opposite to the pre-charge logic value. The second transistor may be an N-channel MOSFET having one high current terminal coupled to the control terminal and another high current terminal coupled to the reference potential.

The at least one interface circuit may additionally or alternatively include switch circuit operable to prevent the at least one logic gate of the combinational logic circuit from producing voltage or current sufficient to provide the control signal to the first transistor in response to a write signal indicative of the write operation in which the logic value to be written is opposite to the pre-charge logic value. For example, the switch circuit may include a P-channel MOSFET having one high current terminal coupled to a source (Vdd) potential and another high current terminal coupled to a voltage supply terminal of the at least one logic gate of the combinational logic circuit such that the combinational logic circuit is not provided with operating power in response to the write signal indicating a write operation in which the logic value to be written is opposite to the pre-charge logic value.

The pre-charge circuit may be operable to maintain the global bit line at the pre-charge logic value during a write operation in which a logic value is written to the bit line that is opposite to the pre-charge logic value. For example, the pre-charge circuit may include: a transistor circuit operable to drive the global bit line to the pre-charge logic level in response to a clock signal; and an enable/disable circuit operable to prevent the clock signal from controlling the transistor circuit in response to a write signal indicative of a write operation.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

Figure 1:
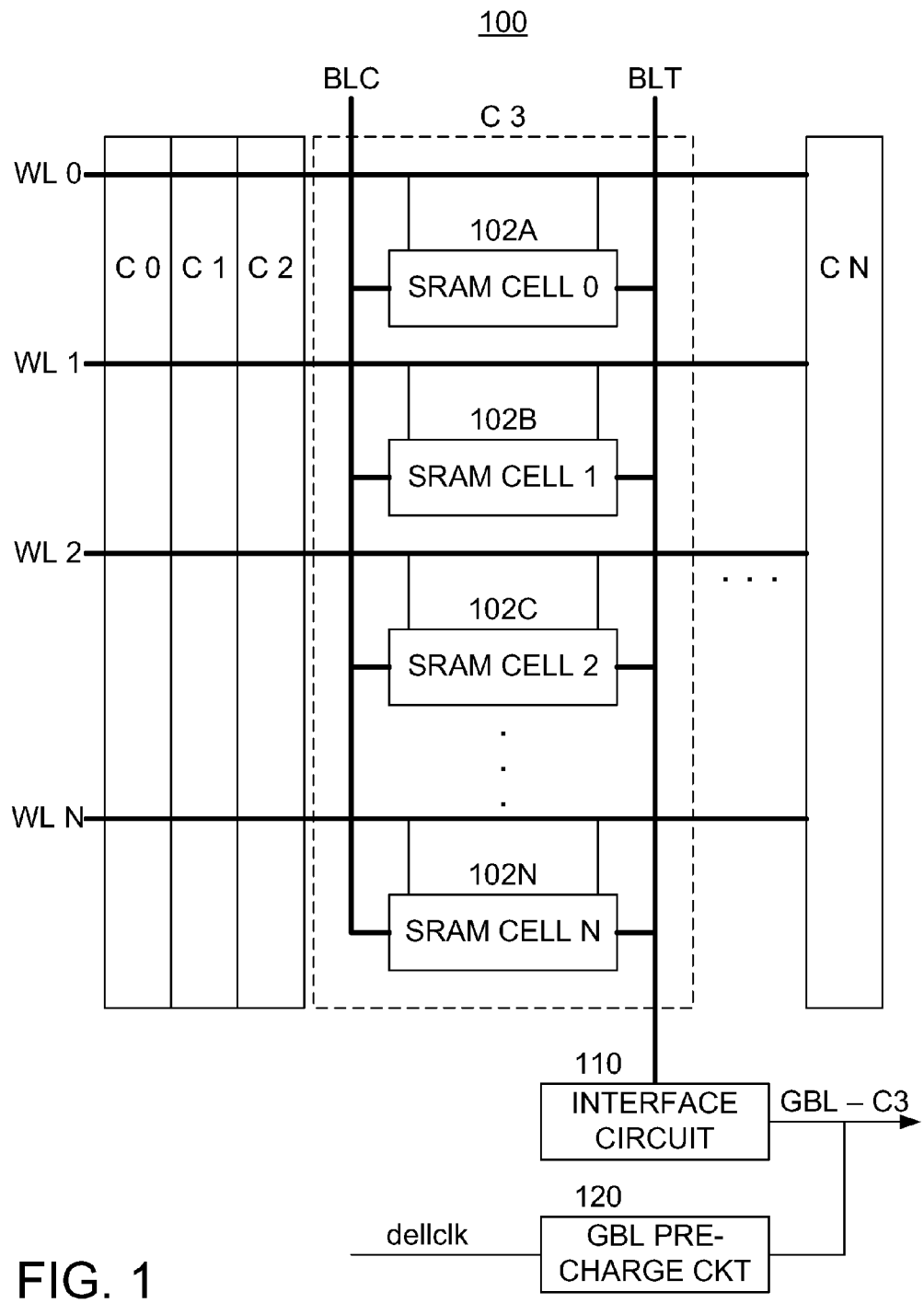
FIG. 1 is a block diagram illustrating an SRAM memory system in accordance with one or more embodiments of the present invention.

With reference to the drawings, wherein like numerals indicate like elements, there is shown in FIG. 1 an SPAM memory system 100 that may be adapted for carrying out one or more features of the present invention. For the purposes of brevity and clarity, the block diagram of FIG. 1 will be referred to and described herein as illustrating an apparatus 100, it being understood, however, that the description may readily be applied to various aspects of a method with equal force.

The SRAM memory system 100 includes a plurality of SRAM memory cells 102 arranged in an array of rows and columns. In general, each row in the array represents a word of data (such as 128 bits in width), and each column in the array represents a given bit position within each word of data. Each word on the SRAM memory system 100 is accessed by activating an associated word line (WL) and bit lines (BLC and BLT). The BLT is the "true" bit line and the BLC is the complementary bit line of the given column, e.g., C3, of the SRAM memory 100. When the true node (or true bit line) is read as a high voltage, the value of the accessed SRAM memory cell 102 is digital one. If the true node is read as a low voltage, the value of the SRAM memory cell 102 is a digital zero.

Figure 5:
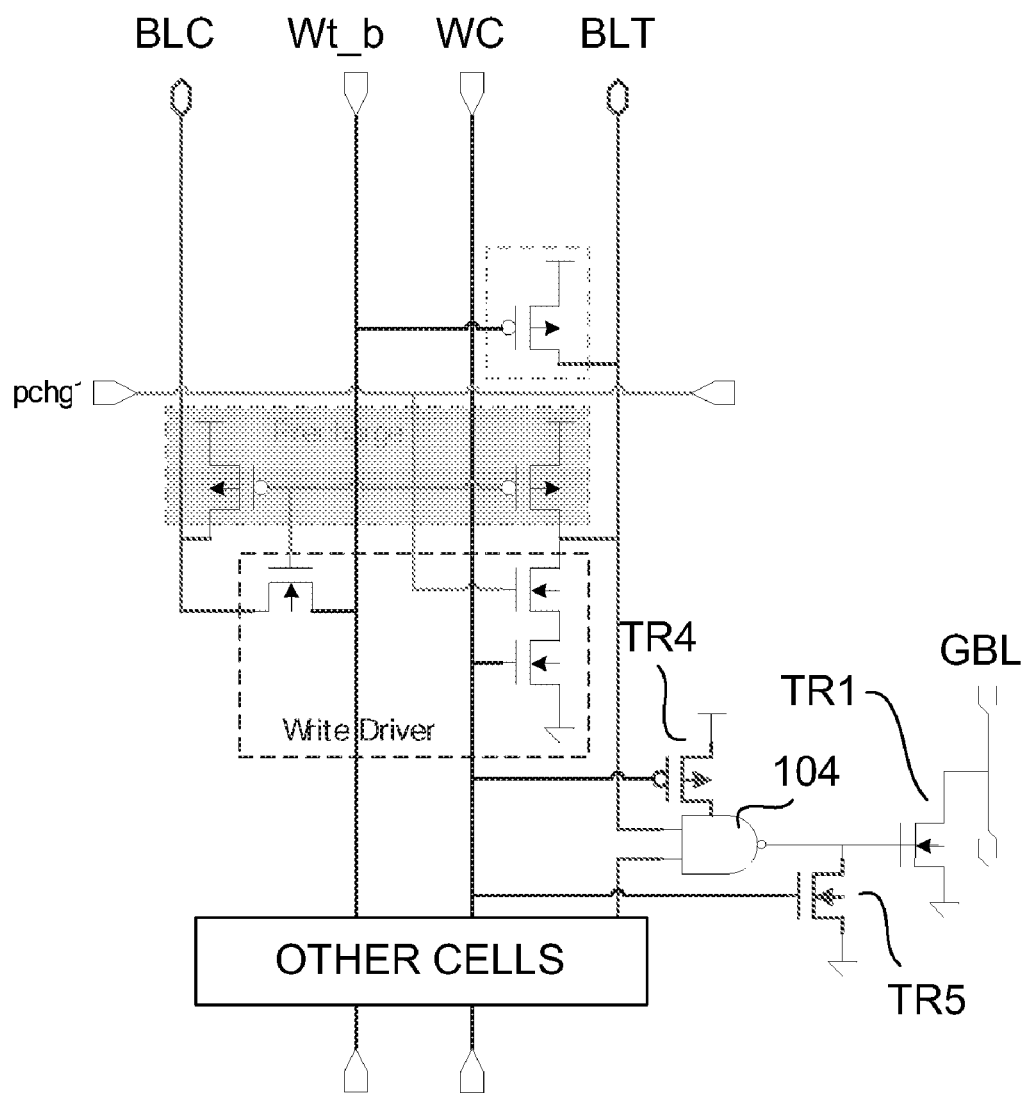
FIG. 5 is a block diagram illustrating other circuits suitable for use with the SRAM memory system of FIG. 1.
Figure 6:
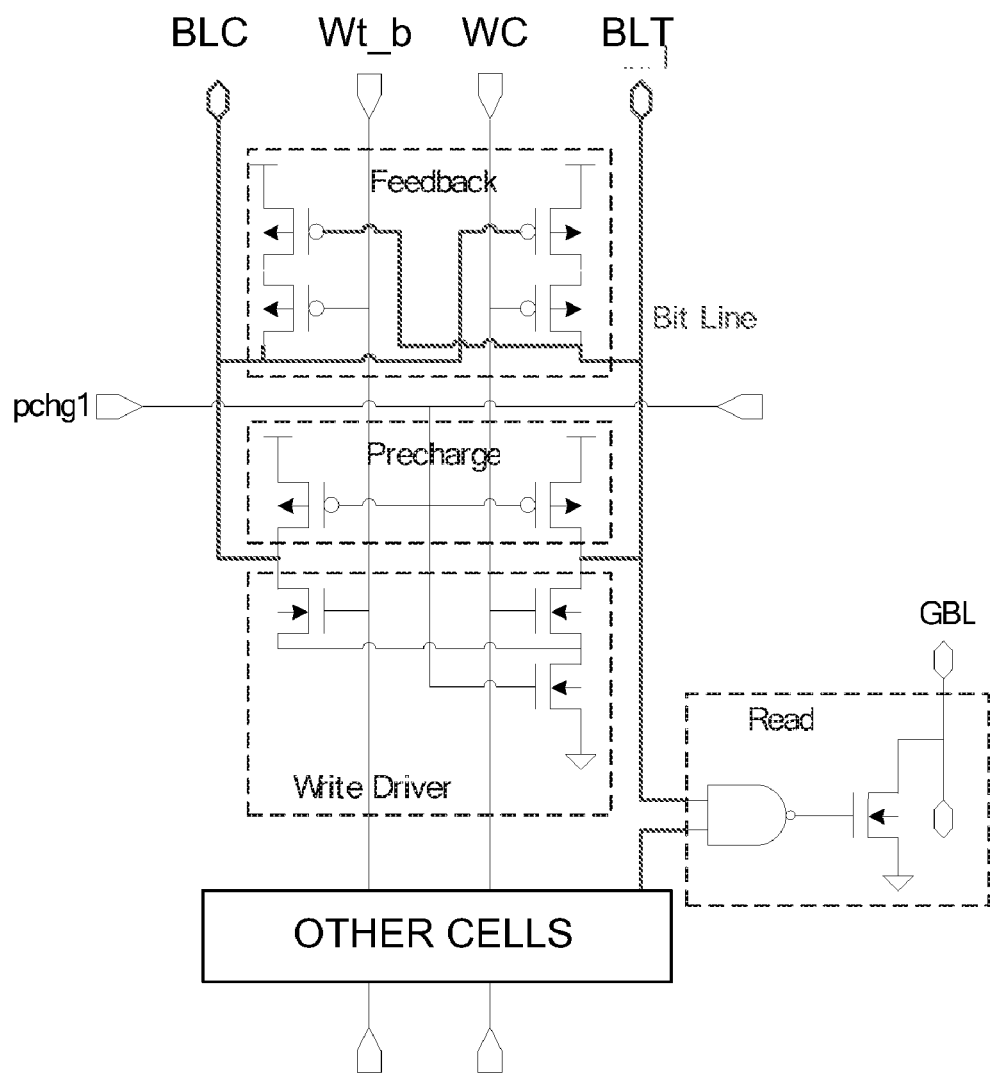
FIG. 6 is a block diagram illustrating an alternative implementation of circuits suitable for use with the SRAM memory system of FIG. 1.

Although not shown in FIG. 1, one skilled in the art will appreciate that a number of further components of the SRAM memory system 100 may be employed, such as read and write pre-charge circuits, a write buffer (driver), feedback circuitry, and further components of a sense amplifier, etc. (Examples of these circuits, however, are shown in FIG. 5, discussed later herein.)

An interface circuit 110 is employed to determine the logic state of the BLT, for example by sensing the voltage potential of the BLT with respect to ground during a read operation. During the read/write operation, the BLT BLC bit lines are pre-charged and then the active components of the SRAM memory cell 102 itself drives the BLT line, which in turn drives the interface circuit 110. The interface circuit 110 provides a higher drive capability to establish the logic value on the global bit line GBL, in this case for column three (C3) of the SRAM memory system 100. A global bit line pre-charge circuit is also employed to drive the global bit line (in this case the GLB for column 3) to a pre-charge logic value in response to a clock signal (dellclk), which may be derived from the system clock.

Figure 2:
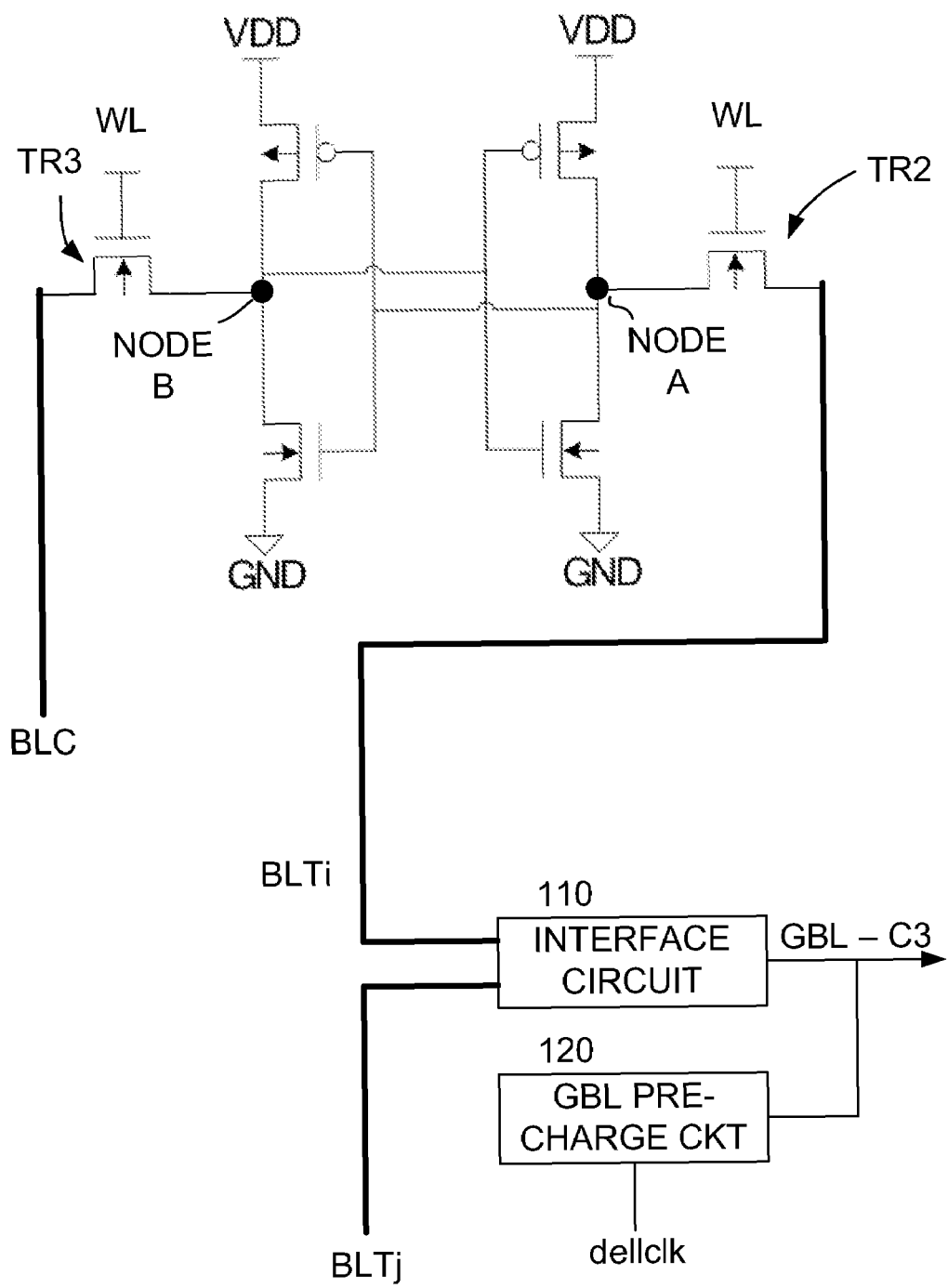
FIG. 2 is a detailed circuit schematic of an embodiment of an SRAM memory cell suitable for use with the system of FIG. 1 and other embodiments herein.

With reference to FIG. 2, a detailed circuit schematic of an example of an SRAM memory cell 102 is illustrated that is suitable for use in the system 100. The SRAM memory cell 102 includes a pair of inverters (or gates) arranged in an anti-parallel configuration. The anti-parallel inverters are implemented using a plurality of (field effect transistors) FETs interconnected such that storage nodes A, B are associated with true bit line BLT and complementary bit line BLC, respectively. For the purposes of illustration, it is assumed that node A is a "true" node and node B is a "complementary" node, which are coupled to the true bit line BLT and the complementary bit line BLC by way of respective NMOS transistors TR2 and TR3. It is noted that while NMOS technology is a preferred implementation for transistors TR2 and TR3, other technologies may be employed without departing from the embodiments of the invention.

The NMOS transistors TR2 and TR3 are controlled by a word line WL signal, which typically activates a plurality of SRAM memory cells used to store a single word of data. The SRAM memory cell 102 includes a PMOS transistor and an NMOS transistor connected in series across the power supply potential, Vdd to Vss (or ground). The true node A is located at the common connection between the PMOS and NMOS transistors. A second set of PMOS and NMOS transistors are interconnected to produce the complementary node B. Again, although this specific circuit topology and implementation is suitable for carrying out one or more embodiments of the invention, those skilled in the art will recognize from the description herein that other implementations are within the scope of the invention.

Figure 3:
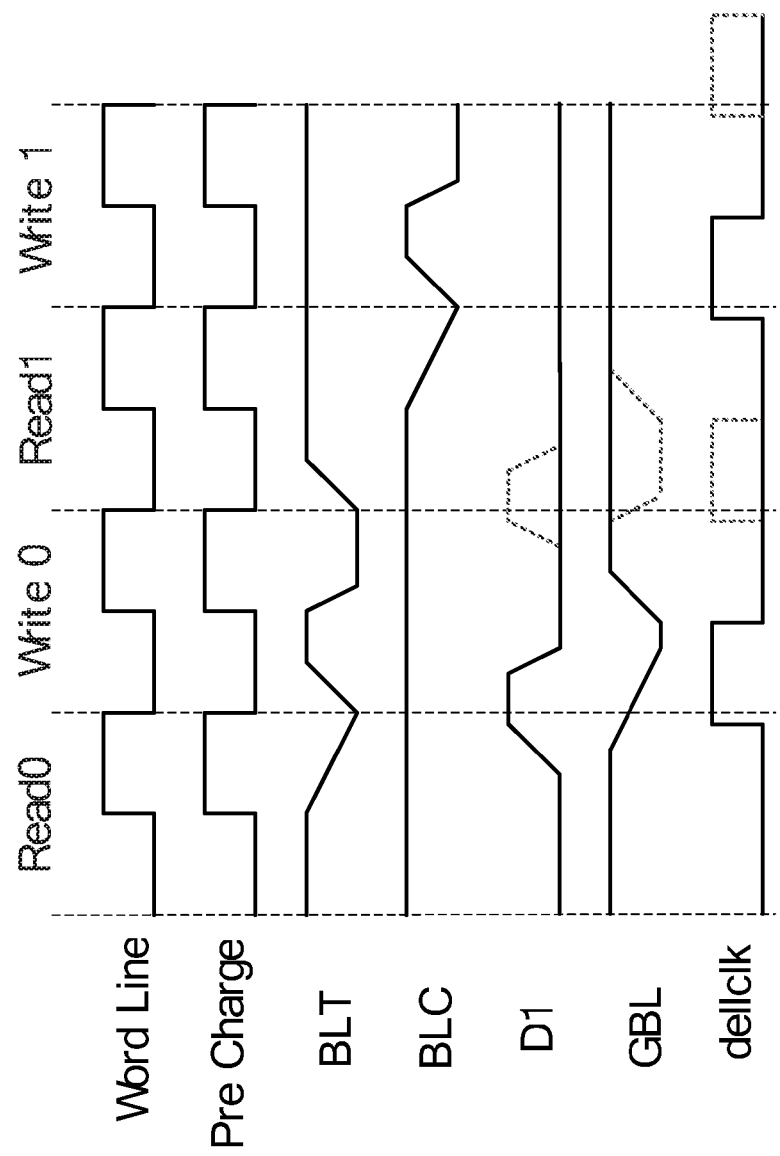
FIG. 3 is a graph illustrating timing relationships among numerous signals in the SRAM memory system of FIG. 1.

With further reference to FIG. 3, a bit of data is written to the SRAM memory cell 102 by turning on the respective NMOS transistors via the word line WL and presenting a potential voltage across the bit line BLT and the complementary bit line BLC. In accordance with one or more embodiments of the present invention, a high voltage potential (e.g., Vdd) on the true node A and a relatively low voltage potential (e.g., ground) on the complementary node B is interpreted as a logic high or digital one. Conversely, a relatively low voltage potential on the true node A and a relatively high voltage potential on the complementary node B is interpreted as a logic low or digital zero. It is noted that the read and write pre-charge circuits (not shown) operate to drive the voltage on the bit line BLT and the complementary bit line BLC to certain voltage potentials prior to a read operation or a write operation to the SRAM memory cell 102.

During a write operation in which a logic high is written to the memory cell 102 (labeled Write 1 in FIG. 3), the bit line BLT is driven to the Vdd potential and the complementary bit line BLC is driven to Vss (e.g., ground). Under these conditions, the PMOS transistor associated with the true node A will turn on, the NMOS transistor associated with the true node A will turn off, the PMOS transistor associated with the complementary node B will turn off, and the NMOS transistor associated with the complementary node B will turn on. Thus, the true node A will be substantially at the Vdd voltage potential and the complementary node B will be substantially at the Vss (or ground) voltage potential.

Those skilled in the art will appreciate that an opposite condition will be achieved during a write operation in which a logic low is written to the memory cell 102 (labeled Write 0 in FIG. 3). The voltage potentials driving the bit line BLT and the complementary bit line BLC are reversed during a write 0 operation (as compared with a write 1 operation) The bit line BLT is driven to the Vss potential (e.g., ground) and the complementary bit line BLC is driven to Vdd. Under these conditions, the PMOS transistor associated with the true node A will turn off, the NMOS transistor associated with the true node A will turn on, the PMOS transistor associated with the complementary node B will turn on, and the NMOS transistor associated with the complementary node B will turn off. Thus, the true node A will be substantially at the Vss voltage potential and the complementary node B will be substantially at the Vdd voltage potential.

Notably, prior art techniques exhibit disadvantageous characteristics during the write 0 operation. In particular, the GBL swings from its pre-charge level (logic high) to a logic low level, and then back to a logic high level (as shown by the dashed line in FIG. 3). This voltage swing on the GBL is due to the conventional circuit techniques employed in the prior art interface circuit and the prior art GBL pre-charge circuit. The swing on GBL results in excessive power dissipation during write 0 operations, and the problem is exacerbated at high frequency operation. As will be discussed below, however, embodiments of the present invention avoid the voltage swing on GBL and the resultant power dissipation.

In accordance with one or more embodiments of the present invention, at least one of the interface circuit 110 and the pre-charge circuit 120 are operable such that the global bit line GBL does not change its logic value during a write operation in which a logic value is written to the bit line that is opposite to the pre-charge logic value. Thus, for example, when the pre-charge logic level is a logic high value, and the logic value to be written to the true bit line BLT is opposite to the pre-charge logic value (i.e., a logic low value), then the logic level on the global bit line GBL is maintained at the pre-charge logic value. Preferably, the pre-charge logic value is a supply (Vdd) voltage potential, and thus the logic value to be written to the bit line that is opposite to the pre-charge logic value is a ground potential (Vss).

Figure 4:
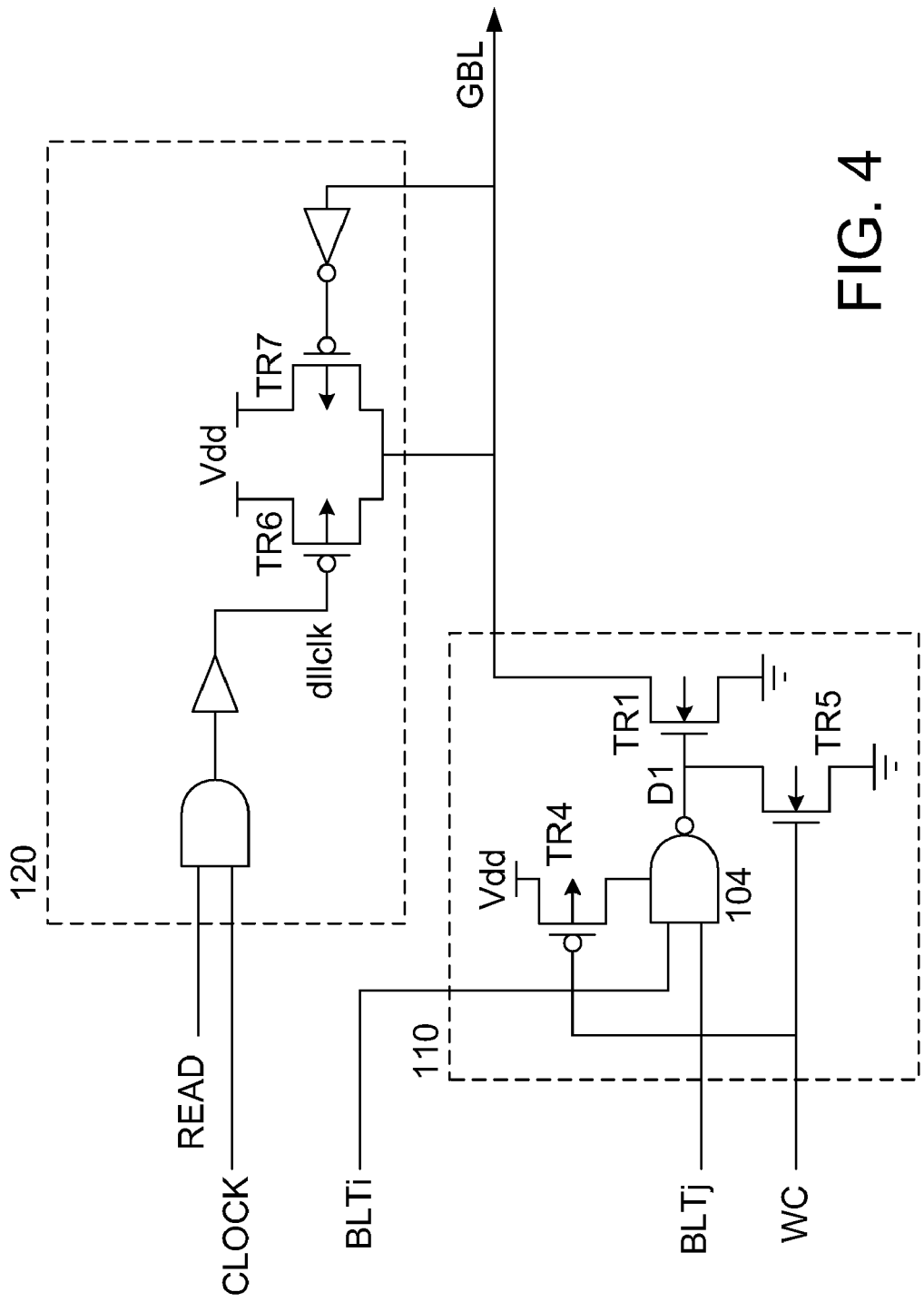
FIG. 4 illustrates detailed circuit diagrams of interface circuitry and pre-charge circuitry for a global bit line, such circuits being suitable for use in the SRAM memory system of FIG. 1 and other embodiments herein.

Reference is now made to FIGS. 4 and 5, which illustrate examples of circuit implementations for the interface circuit 110 and the pre-charge circuit 120. The interface circuit 110 functions to prohibit the mirroring of the logic value of the bit line BLTi (and/or the BLTj of an adjacent memory cell) to the global bit line GBL during a write operation in which a logic value is written to the bit line BLT that is opposite to the pre-charge logic value. For the purposes of illustration, the description below will refer to the monitoring of the data on BLTi, and may simply refer to BLT. The interface circuit 110 includes combinational logic and transistor circuitry for mirroring the logic value of the bit line BLT to the global bit line GBL. For example, the combinational logic circuitry includes a NAND gate 104 and a transistor TR1 (such as a N-channel MOSFET) to sense the voltage potential of the BLT with respect to ground. During read operations, the BLT BLC bit lines are pre-charged and then the active components of the SRAM memory cell 102 itself drives the BLT line, which in turn drives one of the input terminals of the NAND gate 104. The transistor TR1 provides a higher drive capability to establish the logic value on the global bit line GBL. The transistor TR1 includes a high current terminal (e.g., the drain thereof) that switches the global bit line GBL to a reference potential (e.g., Vss) in response to a control signal on a control terminal (e.g., the gate) thereof. The NAND gate 104 is operable to provide the control signal to the gate of the transistor TR1 as a function of the bit line BLT.

The interface circuit 110 includes a transistor TR5 (such as a N-channel MOSFET) having a high current terminal (e.g., the drain) that shunts the control signal from the gate of the transistor TR1 to a reference potential (e.g., Vss) in response to a write signal WC. The signal WC is indicative of the write operation in which the logic value to be written is opposite to the pre-charge logic value, e.g., write 0. The WC and Wt_b signals are produced by the system in which the apparatus 100 is used, and they indicate whether a logic low or high is to be written. The write driver circuit and the feedback circuit (FIG. 5) respond to the WC and Wt_b signals to place appropriate voltage potentials on the BLT BLC lines during write operations (as discussed above). In accordance with one or more embodiments of the present invention, however, at least one of the WC and Wt_b signals are employed to provide information to the interface circuit 110. Thus, the transistor TR5 shunts the control signal from the gate of the transistor TR1 (turning it off) in response to the WC signal indicating that a write 0 operation is underway.

The interface circuit 110 may also include an switch circuit operable to prevent the combinational logic circuit (e.g., the NAND gate 104) from producing voltage or current sufficient to provide the control signal to the gate of the transistor TR1 in response to the WC signal. The switch circuit may include a transistor TR4, such as a P-channel MOSFET, having one high current terminal (e.g., the drain thereof) coupled to a source (Vdd) potential and another high current terminal (e.g., the source thereof) coupled to a voltage supply terminal of the NAND gate 104. Thus, the combinational logic circuit is not provided with operating power in response to the write signal WC indicating a write operation (e.g., a write 0).

The pre-charge circuit 120 is operable to maintain the global bit line GBL at the pre-charge logic value (e.g., high) during a write operation in which a logic value is written to the bit line that is opposite to the pre-charge logic value (e.g., write 0). The pre-charge circuit 120 may include a transistor circuit operable to drive the global bit line GBL to the pre-charge logic level in response to a clock signal (dllclk) derived from another clock signal CLOCK (which may be derived from the system clock) The transistor circuit may include a pair of transistors TR6 and TR7, which in this example are P-channel MOSFETs. The pre-charge circuit 120 may also include an enable/disable circuit operable to prevent the clock signal (CLOCK) from controlling the transistor circuit in response to a write signal indicative of a write operation. This is accomplished, for example, by enabling the CLOCK signal using a read signal indicating that a read operation is to take place. Thus, the pre-charge circuit 120 is only active during read operations, no write operations.

With reference to FIG. 3 and the above discussion, at least one of the interface circuit 110 and the pre-charge circuit 120 are operable such that the global bit line GBL does not change its logic value during a write operation in which a logic value is written to the bit line that is opposite to the pre-charge logic value. Thus, the GBL does not swing upon a write 0 operation (as would otherwise occur using prior art techniques). With regard to the interface circuit the control signal D1 on the gate of TR1 does not go high in response to a low value on the bit line BLT. In addition (or in the alternative), the signal dellclk does not clock the transistors TR6, TR7 in response to the CLOCK signal during write operations (including write 0).

Advantageously, the use of the interface circuit 110 and/or the pre-charge circuit 120 to maintain the GBL at the pre-charge logic level during write 0 operations results in significant reduction of power dissipation in the memory system 100, particularly when successive write 0 operations are performed at a relatively high frequency.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An SRAM memory system, comprising:
a plurality of memory cells arranged in an array of rows (word lines) and columns (bit lines);
at least one interface circuit operable to mirror logic values of at least one of the bit lines to a global bit line; and
at least one pre-charge circuit operable to drive the global bit line to a pre-charge logic value in response to a clock signal,
wherein the at least one interface circuit includes:
a first transistor having a high current terminal that switches the global bit line to a reference potential in response to a control signal on a control terminal thereof;
a combinational logic circuit including at least one logic gate operable to provide the control signal to the first transistor as a function of the bit line;
a second transistor having a high current terminal that shunts the control signal from the control terminal of the first transistor to a reference potential such that the interface circuit is prohibited from mirroring the logic value of the bit line to the global bit line in response to a write signal indicative of a write operation in which a logic value is written to the bit line that is opposite to the pre-charge logic value.

2. The SRAM memory system of claim 1, wherein the pre-charge logic value is a logic high value and the logic value to be written to the bit line that is opposite to the pre-charge logic value is a logic low value.

3. The SRAM memory system of claim 1, wherein the pre-charge logic value is a supply (Vdd) voltage potential, and the logic value to be written to the bit line that is opposite to the pre-charge logic value is a ground potential.

4. The SRAM memory system of claim 1, wherein the second transistor is a N-channel MOSFET having one high current terminal coupled to the control terminal and another high current terminal coupled to the reference potential.

5. The SRAM memory system of claim 1, wherein the at least one interface circuit includes a switch circuit operable to prevent the at least one logic gate of the combinational logic circuit from producing voltage or current sufficient to provide the control signal to the first transistor in response to a write signal indicative of the write operation in which the logic value to be written is opposite to the pre-charge logic value.

6. The SRAM memory system of claim 5, wherein the switch circuit includes a P-channel MOSFET having one high current terminal coupled to a source (Vdd) potential and another high current terminal coupled to a voltage supply terminal of the at least one logic gate of the combinational logic circuit such that the combinational logic circuit is not provided with operating power in response to the write signal indicating a write operation in which the logic value to be written is opposite to the pre-charge logic value.

7. A method of controlling an SRAM memory, the SRAM memory including a plurality of memory cells arranged in an array of rows (word lines) and columns (bit lines), comprising:
mirroring logic values of at least one of the bit lines to a global bit line using at least one interface circuit;
driving the global bit line to a pre-charge logic value in response to a clock signal that cycles at least one time during successive read and write operations to the memory cell;
switching the global bit line to a reference potential in response to a signal controlling a first transistor coupled in shunt from the global bit line to the reference potential, the signal being produced by a combinational logic circuit including at least one logic gate as a function of the bit line; and
shunting the signal from the first transistor to the reference potential using a second transistor such that the interface circuit is prohibited from mirroring the logic value of the bit line to the global bit line in responce to a write signal indicative of a write operation in which a logic value is written to the bit line that is opposite to the pre-charge logic value.

8. The method of claim 7, wherein the pre-charge logic value is a logic high value and the logic value to be written to the bit line that is opposite to the pre-charge logic value is a logic low value.

9. The method of claim 8, wherein the pre-charge logic value is a supply (Vdd) voltage potential, and the logic value to be written to the bit line that is opposite to the pre-charge logic value is a ground potential.

* * * * *